United States Patent [19]
Pickrell et al.

[11] Patent Number: 5,350,461
[45] Date of Patent: Sep. 27, 1994

[54] LOW TEMPERATURE $P_2O_5$ OXIDE DIFFUSION SOURCE

[75] Inventors: Gary R. Pickrell, Blacksburg, Va.; James E. Rapp, Oregon, Ohio

[73] Assignee: Techneglas, Inc., Perryburg, Ohio

[21] Appl. No.: 986,940

[22] Filed: Dec. 8, 1992

[51] Int. Cl.⁵ .......................................... H01L 21/225
[52] U.S. Cl. ...................... 148/33; 252/950; 252/951; 423/263; 423/305; 423/306; 437/164; 437/168; 501/152
[58] Field of Search .............. 501/152; 252/950, 951; 437/164, 168; 423/263, 305, 306; 148/33

[56] References Cited

U.S. PATENT DOCUMENTS

| | | | |
|---|---|---|---|
| 4,025,464 | 5/1977 | Yamashita et al. | 252/950 |
| 4,033,790 | 7/1977 | Gunjigake et al. | 252/950 |
| 4,141,738 | 2/1979 | Rapp | 437/168 |
| 4,175,988 | 11/1979 | Rapp | 252/950 |
| 4,800,175 | 1/1989 | Rapp | 437/160 |
| 4,846,902 | 7/1989 | Pickrell | 148/33 |
| 4,891,331 | 1/1990 | Rapp | 437/164 |

FOREIGN PATENT DOCUMENTS 51-083773  7/1976  Japan ..................... 252/950

*Primary Examiner*—Anthony Green
*Attorney, Agent, or Firm*—Marshall & Melhorn

[57] ABSTRACT

The present invention relates to a solid low temperature phosphorus diffusion source that is an $R_2O_3/P_2O_5$ compound in which the ratio of $R_2O_3$ to $P_2O_5$ is 1 to 5 and R is Nd, Eu, Pr, Sm, Ho, Tb, Er, Yb, Tm or Dy. The invention also relates to a method of making the diffusion source, a method of using the diffusion source to evolve $P_2O_5$ to dope a silicon wafer, and the doped silicon wafer.

5 Claims, No Drawings

LOW TEMPERATURE $P_2O_5$ OXIDE DIFFUSION SOURCE

The present invention relates to a solid low temperature phosphorus diffusion source that is an $R_2O_3/P_2O_5$ compound in which the ratio of $R_2O_3$ to $P_2O_5$ is 1 to 5 and R is Nd, Eu, Pr, Sm, Ho, Tb, Er, Yb, Tm or Dy. The invention also relates to a method of making the diffusion source, a method of using the diffusion source to evolve $P_2O_5$ to dope a silicon wafer, and the doped silicon wafer.

BACKGROUND OF THE INVENTION

A solid diffusion source comprising glass ceramic or polycrystalline particles is disclosed in the Rapp U.S. Pat. No. 4,141,738. In U.S. Pat. No. 4,033,790 there is disclosed solid diffusion sources made by hot pressing $R_2O_3/P_2O_5$ ($La_2O_3/P_2O_5$, $Ce_2O_3/P_2O_5$ and $Y_2O_3/P_2O_5$) compounds in which the $R_2O_3$ to $P_2O_5$ is mainly 1 to 5. The above U.S. Patents are incorporated by reference.

U.S. Pat. No. 4,846,902 discloses a solid diffusion source that is a Gd oxide/$P_2O_5$ compound in which the ratio of Gd oxide to $P_2O_5$ to about 1/1 to 1/5.

It is desirable to provide a solid diffusion source that is easily and efficiently made, and a source that evolves $P_2O_5$ relatively rapidly at a relatively low temperature.

OBJECTS OF THE INVENTION

It is an object of the present invention to prepare a doping composition as a diffusion source, to provide a doped silicon wafer, the composition being a penta phosphate $R_2O_3/P_2O_5$ in which the ratio of $R_2O_3$ to $P_2O_5$ is 1 to 5 and R is Nd, Eu, Pr, Sm, Ho, Tb, Er, Yb, Tm or Dy.

It is an object of the present invention to provide a method of making a doped silicon wafer using a solid diffusion source, the method comprising the steps of:

A. heating $R_2O_3$ oxide and $H_3PO_4$ to provide a $R_2O_3$ oxide/$P_2O_5$ composition consisting essentially of a $R_2O_3/P_2O_5$ compound in which the ratio of $R_2O_3$ to $P_2O_5$ is 1 to 5 and R is Nd, Eu, Pr, Sm, Ho, Tb, Er, Tm, Yb or Dy.

B. firing the composition to evolve $P_2O_5$ to deposit a phosphorus containing coating on the silicon wafer at a relatively low temperature and at a relatively high rate to form a glassy layer on the silicon wafer.

These and other objects will be apparent from the specification that follows and the appended claims.

SUMMARY OF THE INVENTION

The present invention provides a composition for a solid diffusion source to deposit a phosphorus oxide coating on a silicon wafer, the composition consisting essentially of an $R_2O_3/P_2O_5$ compound in which the ratio of $R_2O_3$ to $P_2O_5$ is about 1 to 5, and R is Nd, Eu, Pr, Sm, Ho, Tb, Er, Yb, Tm or Dy.

The present invention also includes a method of using the doping source by firing it at about 750° or 800° C. up to about 950° or 975° C.; and the doped silicon wafer itself.

The present invention also provides a method of making and using the doping source at a temperature preferably at about 800° to 925° C.

The present invention also provides a doping composition in which the above described penta phosphate doping compound contains $ZrO_2$. The present invention also provides the above-described $R_2O_3 \cdot 5P_2O_5$ compound in which it contains $ZrO_2$.

DETAILED DESCRIPTION OF THE INVENTION

In the present invention, R is Group IIIa element (according to the Periodic Chart of the Elements, Page 46 of the International Critisol Tables of Numerical Data, Physics, Chemistry and Technology, 1926, McGraw-Hill). The suitable group IIIa elements have atomic numbers from 59–70 but not 64.

In one aspect, the R element has an atomic number from 59–63 (Pr, Nd, Sm and Eu). Suitable R elements also have an atomic number from 65–70 (Tb, Dy, Ho, Er, Tm and Yb) and preferably 66–68 or from 57–63 but not 61.

Preferred R elements are Yb, Dy, Er and Sm—these compounds being colorless or white or near white. Suitable R elements are Pr, Nd, Tb and Eu.

The pentaphosphate compounds evolve $P_2O_5$ to provide a glassy layer of about 300 or 400 or 500A° up to 1000–2500A° generally at a temperature at about 750° to 975° C. and as high as 1025° C.

EXAMPLE 1

Various $R_2O_3 \cdot 5P_2O_5$ sources were prepared using stoichiometric amounts of $R_2O_3$ and $P_2O_5$ (in the $H_3PO_4$ starting material) as described in the Pickrell U.S. Pat. No. 4,846,902 for $R_2O_3 \cdot 5P_2O_5$ materials and in U.S. Pat. No. 4,033,790 for $Gd_2O_3 \cdot 5P_2O_5$ materials.

In each case, the $R_2O_3$ and $H_3PO_4$ were mixed with a excess of $H_3PO_4$. The excess water is evaporated off, and the mixed product fired at 750° C. for 15 hours to provide the $R_2O_3 \cdot 5P_2O_5$ product.

The fired material was pressed and sintered as in the U.S. Pat. No. 4,033,790, the resultant billet being sliced into individual diffusion source wafers.

In a typical formulation, the following was mixed in approximate grams to provide approximately the following mixture:

| Ingredients | Grams |
| --- | --- |
| $Nd_2O_3$ (1 mole per 5 moles $P_2O_5$) | 112 |
| $H_3PO_4$ (85%) | 384 |

The procedure followed is set forth in the aforementioned Pickrell U.S. Pat. No. 4,846,902, the water of the $R_2O_3/P_2O_5$ mixture being driven off the mixture by heating at 150° C. Thereafter, the crucible was covered and fired at 750° C. for 15 hours to provide the neodymium oxide/$5P_2O_5$ product. The resultant crystalline product was ball-milled to obtain a fine powder (−60 mesh).

Silicon wafers and the diffusion source were heated to 900° C. and the pentaphosphate source fired at 900° C. for 1 hour to evolve $P_2O_3$ and coat the heated wafers with a glassy film of about 1000A° in thickness. This is a sufficient amount of glass to satisfactorily dope the wafer at 900° C. The sheet resistively of the doped wafer was satisfactory. Excellent film thickness also was obtained by firing for 1 hour at 825° to 975° C.

Other doping source $R_2O_3 \cdot 5P_2O_5$ compounds were prepared and fired for 1 hour to evolve $P_2O_5$ at the temperature indicated in the table below to coat silicon wafers with a glassy film of about 300–2000A°.

| $R_2O_3.5P_2O_5$ Compound | Firing Temperature °C. |
| --- | --- |
| $Pr_2O_3.5P_2O_5$ | 850–950 |
| $Nd_2O_3.5P_2O_5$ | 825–950 |
| $Sm_2O_3.5P_2O_5$ | 850–950 |
| $Dy_2O_3.5P_2O_5$ | 850–975 |
| $Er_2O_3.5P_2O_5$ | 850–1025 |
| $Er_2O_3.ZrO_2.5P_2O_5$ | 800–975 |

$Er_2O_3 \cdot 5P_2O_5$ evolves $P_2O_5$ at a good rate over a wide temperature range, glassy films of 200A° or more deposited at 800° to 1025° C.

As in the case of $Er_2O_3 \cdot ZrO_2 \cdot 5P_2O_5$, substantially similar results can be obtained by the use of $ZrO_2$ in the other rare earth oxide/·$5P_2O_5$ compounds.

In the $R_2O_3 \cdot 5P_2O_5$ compounds, R is a Group IIIa rare earth element (International Critical Tables) having an atomic number as follows:

| R | Atomic Number |
| --- | --- |
| Pr | 59 |
| Nd | 60 |
| Sm | 62 |
| Eu | 63 |
| Tb | 65 |
| Dy | 66 |
| Ho | 67 |
| Er | 68 |
| Tm (or Tu) | 69 |
| Yb | 70 |

The above examples illustrate the $R_2O_3 \cdot 5P_2O_5$ diffusion sources, the methods of making the diffusion sources, the methods of using the sources by firing the same to evolve $P_2O_5$, and methods of making the doped silicon wafers that are useful in a typical emitter diffusion, in channel MOS diffusion and in the doping of a polysilicon layer without undesirable toxic gases and liquids.

What is claimed is:

1. A composition for a solid diffusion source to deposit a phosphorus oxide coating on a silicon wafer, the composition consisting essentially of an $R_2O_3/P_2O_5$ compound in which the ratio of $R_2O_3$ to $P_2O_5$ is about 1:5, and R is Nd Eu, Pr, Sm, Ho, Tb, Er, Yb, Tm or Dy.

2. A composition as defined in claim 1 in which R is Nd, Eu, or Pr.

3. A composition as defined in claim 1 in which R is Sm, Ho, Tb or Er.

4. A composition as defined in claim 1 in which R is Tm, Tb or Dy.

5. A composition as defined in claim 1 in which the $R_2O_3/P_2O_5$ compound contains $ZrO_2$.

* * * * *